United States Patent [19]

Jackson, Jr.

[11] Patent Number: 4,488,507

[45] Date of Patent: Dec. 18, 1984

[54] SUSCEPTORS FOR ORGANOMETALLIC VAPOR-PHASE EPITAXIAL (OMVPE) METHOD

[76] Inventor: David A. Jackson, Jr., 7917 Carrleigh Pkwy., Springfield, Va. 22152

[21] Appl. No.: 429,656

[22] Filed: Sep. 30, 1982

[51] Int. Cl.³ ............................................. C23C 13/12
[52] U.S. Cl. .................................. 118/726; 118/728; 118/725; 118/500; 219/10.49 R
[58] Field of Search ............... 118/728, 729, 730, 725, 118/726, 500; 219/10.49 R, 10.67, 10.43, 10.49 A; 156/613, 614; 373/157, 156

[56] References Cited

U.S. PATENT DOCUMENTS

| | | | |
|---|---|---|---|
| 1,975,438 | 10/1934 | Sorrel | 219/10.49 R |
| 3,892,940 | 7/1975 | Bloem et al. | 219/10.67 |
| 4,275,282 | 6/1981 | Miller | 219/10.49 R |
| 4,386,255 | 5/1983 | Berkman et al. | 118/725 |

FOREIGN PATENT DOCUMENTS 51-14997  5/1976  Japan ................................. 118/726

Primary Examiner—John D. Smith
Assistant Examiner—Bernard F. Plantz
Attorney, Agent, or Firm—Anthony T. Lane; Robert P. Gibson

[57] ABSTRACT

Susceptor formed with a base and with a pedestal made of materials respectively having low and high radio-frequency (r-f) absorptivities. Mercury is carried in a cavity in the base and a semiconductor substrate is carried in a cavity in the pedestal. When an r-f field is applied to the susceptor, the substrate is heated to a higher temperature than the mercury.

7 Claims, 4 Drawing Figures

SUSCEPTORS FOR ORGANOMETALLIC VAPOR-PHASE EPITAXIAL (OMVPE) METHOD

The invention described herein may be manufactured, used, and licensed by the U.S. Government for governmental purposes without the payment of any royalties thereon.

BACKGROUND OF THE INVENTION

This invention is in the field of vapor-phase methods of growing semiconductor layers, and is particularly concerned with those methods using organometallic vapors. In a specific case of the method whereby mercury cadmium telluride alloys are grown, gaseous cadmium and tellurium alkyls pyrolytically decompose in the vicinity of a heated substrate contained in a mercury vapor atmosphere. The cadmium, tellurium and mercury combine on the substrate to form the alloy. Heretofore, the substrate and means for providing the mercury vapor have been heated by two different heaters, since two different temperatures are required. Unfortunately, these two heaters, with their controls and connections, make the system for carrying out the method unnessarily cluttered and complicated. The method whereby these disadvantages is overcome is shown in my copending U.S. patent application Ser. No. 426,428, filed Sept. 29, 1982, now U.S. Pat. No. 4,439,267, issued Mar. 27, 1984. The susceptor as used in that copending invention is shown in this application.

SUMMARY OF THE INVENTION

The invention is a unitary susceptor device which serves as a substrate holder and as a mercury reservoir in a system for producing mercury-containing semiconductor alloys by the vapor-phase epitaxial method. The susceptor is made of a material capable of being heated by energy from an adjacent radio-frequency coil and is constructed such that different regions thereof absorb the energy by different amounts. These different absorptions thus provide different temperature regions. The susceptor may take any one of several forms, such as a stepped block with the step made of a better r-f absorber than the remainder of the block. Alternatively, the susceptor may be a solid of revolution with a base and pedestal portions. The base is made of a material having a lower r-f absorptivity than the pedestal and has a groove for mercury formed therein.

DESCRIPTION OF PREFERRED EMBODIMENTS

Figure 1:
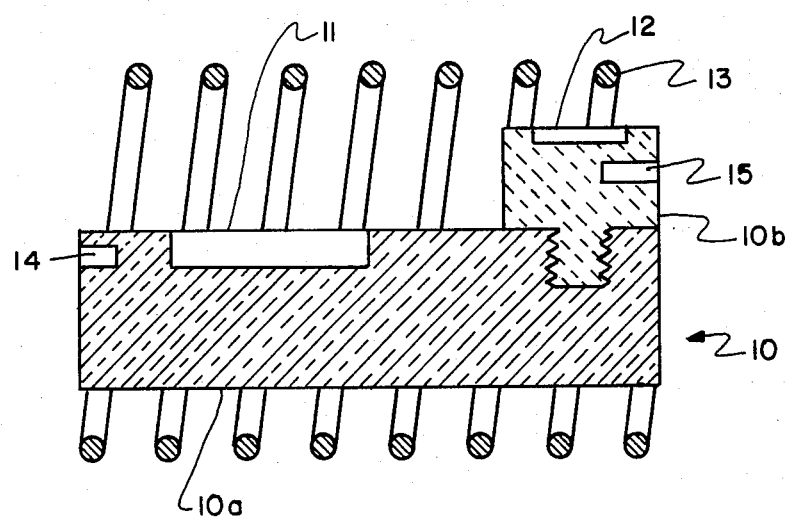
FIGS. 1 and 2 are cross-sectional showings of two of horizontal susceptor embodiments.

Before beginning the description of the invention as shown by the drawings, some general notes about the invention may be useful. The dual-purpose susceptor of the invention has the same general construction, whether it is intended for horizontal or vertical use. Specifically, the susceptor must include two basic parts: a mercury reservoir and a pedestal for holding a single-crystal substrate; the parts must be maintained at two temperatures for the OMVPE method. These temperatures are gained by constructing the pedestal of a material having a higher r-f absorptivity than the mercury reservoir, such that, in an r-f field, the substrate on the pedestal reaches a higher temperature than the mercury. FIG. 1 shows a specific embodiment of the invention wherein reference numeral 10 generally designates the susceptor. This susceptor is comprised of generally parallelepiped base 10a composed of a material having a relatively low r-f absorptivity and with mercury reservoir 11 formed therein, and a pedestal 10b composed of a material having a higher r-f absorptivity than the base, in the shape of a section of a right circular cylinder with substrate cavity 12 formed therein. As can be seen on the drawings, 10b is made with a threaded portion which screws into 10a, but could be fixed to 10a by other means, such as adhesive bonding, etc. The materials from which 10a and 10b are made must meet certain requirements; both must be chemically and mechanically stable at OMVPE temperatures; neither can be reactive to mercury vapor or liquid. Moreover, 10b must not be reactive to the substrate placed in 12. Also, 10a and 10b should be approximately matched in thermal coefficients of expansion and should both be easy to form or machine to the desired shapes. The preferred materials for 10a and 10b are fired Lava and graphite, although other materials may meet the requirements set forth above and may be used. Susceptor 10, when used in a OMVPE method as described in my copending patent application referred to above, is heated by r-f coil 13 supplied by a r-f oscillator (not shown). The temperatures of 10a and 10b may be checked (or continuously monitored) by a thermocouple (not shown) inserted into respective bores 14 and 15.

Figure 2:
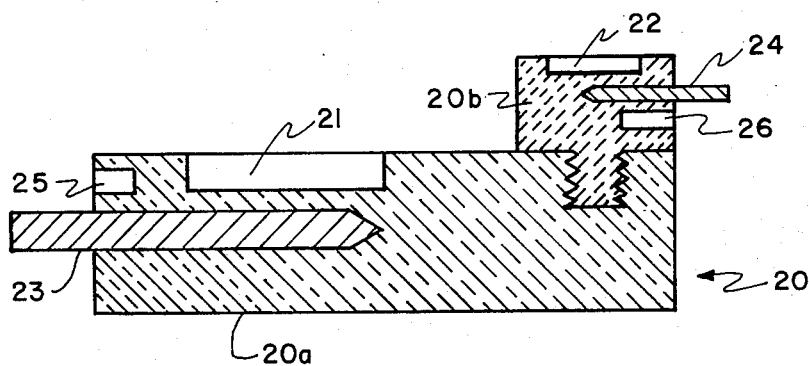

FIG. 2 shows an embodiment similar to FIG. 1, but with temperature tuning slugs added. Reference numeral 20 generally designates the susceptor. This susceptor includes portions 20a and 20b corresponding to 10a and 10b of FIG. 1 and cavities 21 and 22 corresponding to 11 and 12 of FIG. 1. FIG. 2, however, includes round tuning (or other shapes) slugs 23 and 24 not shown in FIG. 1. These slugs are good r-f absorbers and are carried in bores in 20a and 20b and are slidably adjustable in these bores for tuning the temperatures of 20a and 20b. Obviously, if not needed in a particular run of the OMVPE method, either 23 or 24 may be omitted. Bores 25 and 26 correspond to bores 14 and 15 in FIG. 1.

Figure 3:
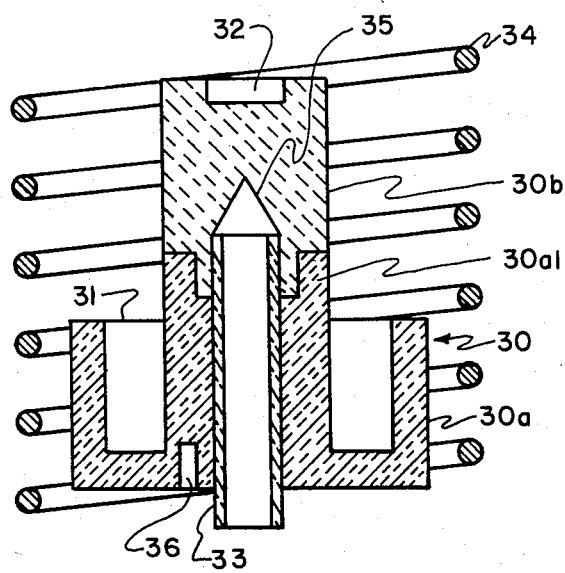
FIGS. 3 and 4 are cross-sectional showings of vertical susceptor embodiments.

FIG. 3 shows one embodiment of a vertical susceptor, generally indicated 30 and including base 30a generally cup-shaped but with columnar portion 30al arising from the bottom of the cup, and pedestal 30b. Both 30a and 30b are bodies of revolution and 30b is formed to fit into columnar portion 30al of 30a, and it could be screwed or otherwise joined thereto. Mercury reservoir or cavity 31 is formed in 30a and substrate cavity 32 is formed in 30b. Susceptor 30 is supported by glass tube 33 and surrounded by r-f coil 34. A thermocouple probe may be inserted into opening 35 of pedestal 30b to measure its temperature, or into base 36 to measure the temperature of base 30a.

Figure 4:
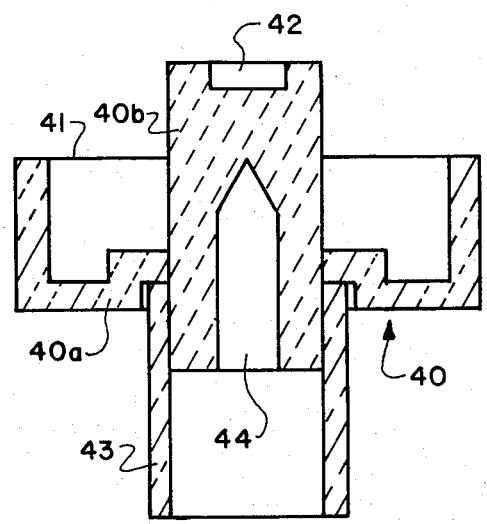

FIG. 4 is a vertical susceptor somewhat similar to FIG. 3, but is tunable for temperature. Susceptor 40 includes base or cup-shaped part 40a with a perforation in the bottom of the cup, and adjustable pedestal 40b. As parts 30a and 30b were solids of revolution in FIG. 3, 40a and 40b are also bodies of revolution. Mercury reservoir or cavity 41 is formed in 40a and substrate cavity 42 is formed in 40b. Both 40a and 40b are supported by glass tube 43. A temperature probe may be inserted into base 44 of pedestal 40b to measure its temperature. When reservoir 41 is charged with mercury, the mercury will be in direct physical contact with pedestal 40b and will absorb heat therefore. Although not previously stated, it should be made plain that, in every embodiment of the invention, the mercury is primarily heated by its own r-f absorbance, and that the base which carries the mercury provides little heating since it is constructed of a material having a low r-f absorptivity. Also, the susceptor (all embodiments) may be moved into or out of the r-f coil to achieve the desired temperatures or temperature differential. Naturally, the power supplied to the coils may be varied, as taught in my copending patent application referred to above. Returning to the FIG. 4 embodiment, pedestal 40b may be adjusted up and down in base 40a and tube 43 to achieve the desired temperature differential between cavities 41 and 42. The amount of mercury in 41 will also affect the temperature differential.

The tradenamed material Lava as specified for the susceptor base is a product of the American Lave Corporation, a 3M Company, and its unfixed form is either hydrous aluminum silicate or low-iron talc.

I claim:

1. A susceptor for use in a vapor-growth reactor wherein two different temperature regions are required, and wherein said susceptor is a body constructed at least partially of a radio-frequency energy-absorbing material heated by an adjacent radio-frequency coil, whereby said body includes:

a first volume of a first predetermined radio-frequency absorptivity and with a reservoir formed therein for holding a material to be vaporized; and a second volume of a second predetermined radio-frequency absorptivity higher than said first predetermined radio-frequency absorptivity and with a cavity formed therein for holding a substrate.

2. The susceptor as set forth in claim 1 wherein said body is in the form of a base with a pedestal thereon, and said first and second volumes correspond respectively to said base and said pedestal.

3. The susceptor as set forth in claim 2 wherein said base is generally in the shape of a parallelepiped, and said pedestal is generally in the shape a section of a right circular cylinder.

4. The susceptor as set forth in claim 2 wherein said base is generally cup-shaped and said pedestal is generally in the shape of a section of a right circular cylinder.

5. The susceptor as set forth in claim 4 wherein said base includes a columnar portion arising from the bottom of the cup and wherein said pedestal is atop said columnar portion.

6. The susceptor as recited in claim 4 wherein said base has a central perforation in the bottom of the cup and said pedestal includes a portion slidably extending into said perforation.

7. The susceptor as set forth in claim 3 wherein at least one of said base and said pedestal includes a bore therein with an r-f absorbing material slidably inserted in said bore.

* * * * *